(12) United States Patent
Watanabe

(10) Patent No.: US 11,443,956 B2
(45) Date of Patent: Sep. 13, 2022

(54) METHOD FOR MANUFACTURING SEMICONDUCTOR DEVICE

(71) Applicant: SUMITOMO ELECTRIC INDUSTRIES, LTD., Osaka (JP)

(72) Inventor: Tadashi Watanabe, Yokohama (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 6 days.

(21) Appl. No.: 17/165,199

(22) Filed: Feb. 2, 2021

(65) Prior Publication Data

US 2021/0249522 A1 Aug. 12, 2021

(30) Foreign Application Priority Data

Feb. 6, 2020 (JP) .............................. JP2020-018505

(51) Int. Cl.
| | | |
|---|---|---|
| *H01L 21/311* | (2006.01) | |
| *H01L 29/66* | (2006.01) | |
| *H01L 21/027* | (2006.01) | |
| *H01L 29/40* | (2006.01) | |
| *H01L 29/417* | (2006.01) | |

(Continued)

(52) U.S. Cl.
CPC .... *H01L 21/31144* (2013.01); *H01L 21/0274* (2013.01); *H01L 21/28114* (2013.01); *H01L 21/28141* (2013.01); *H01L 21/823437* (2013.01); *H01L 29/401* (2013.01); *H01L 29/402* (2013.01); *H01L 29/41775* (2013.01);

(Continued)

(58) Field of Classification Search
CPC ........... H01L 21/0274; H01L 21/31144; H01L 21/28114; H01L 21/28141; H01L 21/823437; H01L 29/402; H01L 29/404; H01L 29/41775; H01L 29/42316; H01L 29/4232; H01L 29/401
See application file for complete search history.

(56) References Cited

U.S. PATENT DOCUMENTS

2007/0164322 A1* 7/2007 Smith ............... H01L 29/42312
257/256
2020/0027956 A1* 1/2020 Aoki .................... H01L 29/2003
(Continued)

FOREIGN PATENT DOCUMENTS

JP 2015-220430 12/2015
JP 2016-136547 7/2016

*Primary Examiner* — Joseph C. Nicely
(74) *Attorney, Agent, or Firm* — Smith, Gambrell & Russell, LLP.

(57) ABSTRACT

A method for manufacturing a semiconductor device includes steps of forming a protective film on a semiconductor substrate, forming a resist film on the protective film such that the resist film includes a region where the resist film becomes thicker from a drain electrode to a source electrode, forming a first opening in the resist film by irradiating the resist film in the region with an electron beam and developing the resist film, forming a second opening that exposes an upper surface of the semiconductor substrate by removing the protective film using the resist film in which the first opening is formed as a mask, forming a third opening in the resist film by further developing the resist film after forming the second opening, the third opening being formed by expanding the first opening toward the drain electrode, and forming a gate electrode in the second and the third openings.

4 Claims, 7 Drawing Sheets

(51) Int. Cl.
*H01L 21/28* (2006.01)
*H01L 21/8234* (2006.01)
*H01L 29/423* (2006.01)

(52) U.S. Cl.
CPC .. *H01L 29/66462* (2013.01); *H01L 29/42316* (2013.01)

(56) References Cited

U.S. PATENT DOCUMENTS

2021/0151316 A1\* 5/2021 Chang ................... H01L 29/401
2021/0184010 A1\* 6/2021 Chong .............. H01L 21/02164

\* cited by examiner

METHOD FOR MANUFACTURING SEMICONDUCTOR DEVICE

CROSS-REFERENCE TO RELATED APPLICATION

This application is based upon and claims the benefit of priority of the prior Japanese Patent Application No. 2020-018505, filed on Feb. 6, 2020, the entire contents of which are incorporated herein by reference.

FIELD

The present disclosure relates to a method for manufacturing a semiconductor device, for example, a method for manufacturing a semiconductor device including a step of forming an gate electrode.

BACKGROUND

In a high frequency FET (Field Effect Transistor), a gate length is reduced in order to improve a high frequency characteristic. The transconductance of the FET increases due to the reduction of the gate length. However, in a state where the gate length is reduced, when a source electrode is grounded and a high voltage is applied to a drain electrode for example, an electric field is concentrated at a gate end on a drain electrode side. To mitigate this, field plate (FP) structure is known (e.g. Japanese Patent Application Publication No. 2015-220430 and Japanese Patent Application Publication No. 2016-136547).

SUMMARY

In the FP structure, a field plate (FP) is formed on the drain electrode side of the gate electrode, and a FP is also formed on a source electrode side at the same time. The increase in gate-source capacitance due to the FP on the source electrode side is a factor that deteriorates the high frequency characteristic of the transistor. Therefore, in order to reduce the gate-source capacitance, it is preferable that the length of the FP on the source electrode side is shorter than the length of the FP on the drain electrode side. However, if the gate length is shortened and the FP on the source electrode side is shortened to make the shape of the gate electrode asymmetric in a channel direction, a manufacturing process gets complicated.

It is an object of the present disclosure to provide a simplified manufacturing process capable of forming the gate electrode having an asymmetric shape even when the gate is reduced.

A method for manufacturing a semiconductor device having a source electrode, a drain electrode, and a gate electrode provided between the source electrode and the drain electrode, according to the present disclosure, the method includes steps of: forming a protective film on a semiconductor substrate; forming a resist film on the protective film such that the resist film includes a region where the resist film becomes thicker from the drain electrode to the source electrode, the region being provided between the source electrode and the drain electrode; forming a first opening in the resist film by irradiating the resist film in the region with an electron beam and developing the resist film; forming a second opening that exposes an upper surface of semiconductor substrate by removing the protective film using the resist film on which the first opening is formed as a mask; forming a third opening in the resist film by further developing the resist film after forming the second opening, the third opening being formed by expanding the first opening toward the drain electrode; and forming the gate electrode in the second opening and the third opening.

DESCRIPTION OF EMBODIMENTS

Some embodiments will now be described.
(1) An embodiment of the present disclosure is a method for manufacturing a semiconductor device having a source electrode, a drain electrode, and a gate electrode provided between the source electrode and the drain electrode, the method includes steps of: forming a protective film on a semiconductor substrate; forming a resist film on the protective film such that the resist film includes a region where the resist film becomes thicker from the drain electrode to the source electrode, the region being provided between the source electrode and the drain electrode; forming a first opening in the resist film by irradiating the resist film in the region with an electron beam and developing the resist film; forming a second opening that exposes an upper surface of semiconductor substrate by removing the protective film using the resist film on which the first opening is formed as a mask; forming a third opening in the resist film by further developing the resist film after forming the second opening, the third opening being formed by expanding the first opening toward the drain electrode; and forming the gate electrode in the second opening and the third opening. Thereby, a manufacturing process can be simplified.
(2) It is preferable that the step of forming the resist film includes setting thicknesses of the source electrode and the drain electrode to be larger than a thickness of the protective film, and forming the resist film so as to form the region by covering the source electrode and the drain electrode.
(3) It is preferable that a distance between the region and the source electrode is shorter than a distance between the region and the drain electrode.
(4) It is preferable that, in the step of forming the resist film, a thickness of the source electrode is set to be larger than that of the drain electrode.

Specific examples of a method for manufacturing a semiconductor device according to the present disclosure will be described below with reference to the drawings. It should be noted that the present disclosure is not limited to these examples, but is indicated by claims, and it is intended to include all modifications within the meaning and range equivalent to the claims.

First Embodiment

Figure 1A:
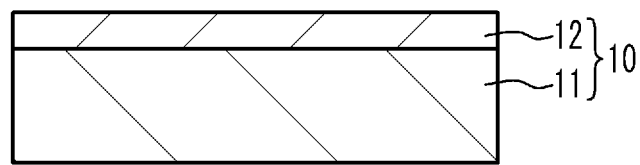
FIGS. 1A to 1D are cross-sectional views illustrating a method for forming a semiconductor device according to a first embodiment (part 1).

FIG. 1A to FIG. 3B are cross-sectional views illustrating a method for forming a semiconductor device according to a first embodiment. As illustrated in FIG. 1A, a semiconductor substrate 10 is prepared. The semiconductor substrate 10 has a substrate 11 and a semiconductor layer 12 formed on the substrate 11. When the semiconductor device is a HEMT (High Mobility Electron Transistor), the substrate 11 is a SiC substrate, a silicon substrate, a GaN substrate, or a sapphire substrate, for example. The semiconductor layer 12 has an AlN layer, a GaN layer, an AlGaN electron supply layer, and a GaN cap layer from a substrate 11 side, for example. The substrate 11 may be a GaAs substrate, whereas the semiconductor layer 12 may be a GaAs layer, an AlGaAs electron supply layer, and a GaAs cap layer from the substrate 11 side. The semiconductor device may be a FET (Field Effect Transistor) other than the HEMT. A direction in which the semiconductor layer 12 is formed on the substrate 11 may be referred to as a film forming direction.

Figure 1B:
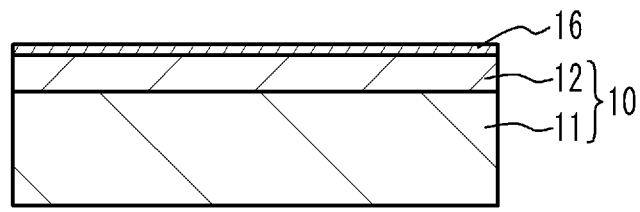

As illustrated in FIG. 1B, a protective film 16 is formed on the semiconductor substrate 10. The protective film 16 is an insulating film such as a silicon nitride film, and is formed by using a CVD (Chemical Vapor Deposition) method. The thickness of the protective film 16 is 60 nm, for example, and can be 50 nm to 200 nm, for example.

Figure 1C:
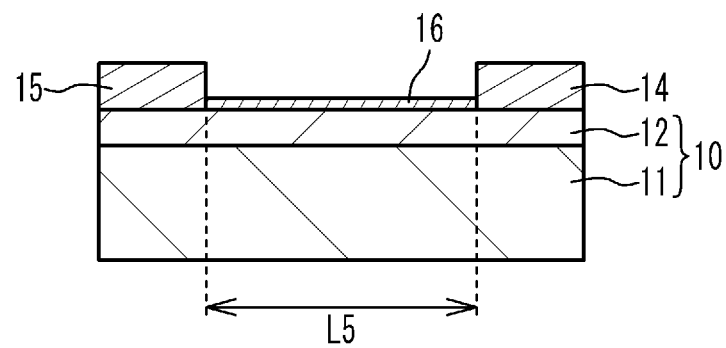

As illustrated in FIG. 1C, openings are formed in the protective film 16. The formation of the openings exposes an upper surface of the semiconductor layer 12 from the protective film 16. A source electrode 14 and a drain electrode 15 are formed in contact with the exposed upper surface of the semiconductor layer 12. The source electrode 14 and the drain electrode 15 include a titanium film and an aluminum film from a semiconductor substrate 10 side, for example. The thickness of each of the source electrode 14 and the drain electrode 15 in the film forming direction is 200 nm, for example, and can be 100 nm to 400 nm, for example. The thicknesses of the source electrode 14 and the drain electrode 15 are approximately the same as each other. A distance L5 between the source electrode 14 and the drain electrode 15 is 2.5 μm, for example, and can be 1 μm to 5 μm, for example.

Figure 1D:
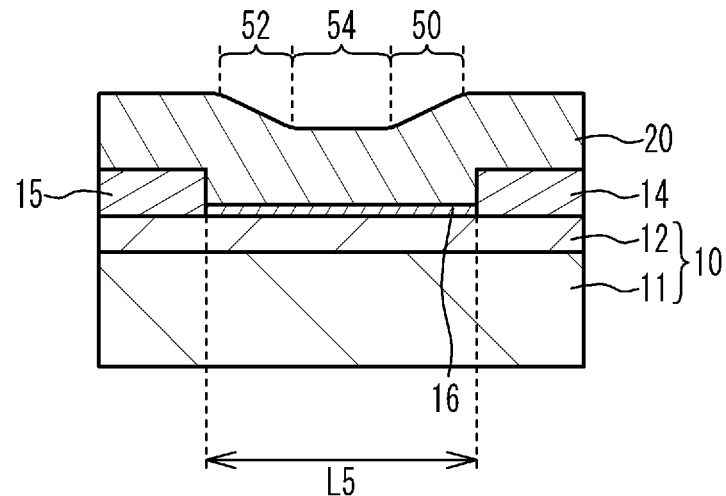

As illustrated in FIG. 1D, a resist film 20 is formed on the semiconductor substrate 10 so as to cover the protective film 16, the source electrode 14 and the drain electrode 15. The resist film 20 is formed using a spin coating method. The thickness of the resist film 20 is, for example, 400 nm on a flat surface, and can be, for example, 200 nm to 800 nm. The flat surface corresponds to a region separated in a channel direction from a step in the film forming direction formed between the protective film 16 and the source electrode 14 (or the drain electrode 15), for example. The channel direction is from the source electrode 14 to the drain electrode 15, for example. The resist is ZEP520A manufactured by ZEON corporation, for example. The ZEP520A includes anisole.

The thickness of the resist film 20 changes along the channel direction due to a difference (a step) in respective thicknesses between the protective film 16 and the source electrode 14 and between the protective film 16 and the drain electrode 15. A substantially central region 54 between the source electrode 14 and the drain electrode 15 is a region (flat region) where the thickness of the resist film 20 is approximately uniform. The flat region may be considered as a part of the above-mentioned flat surface. A region 50 from the region 54 toward the source electrode 14 is a region (a first inclined region) in which the thickness of the resist film 20 becomes thicker toward the source electrode 14. A region 52 from the region 54 toward the drain electrode 15 is a region (a second inclined region) in which the thickness of the resist film 20 becomes thicker toward the drain electrode 15. Therefore, the thicknesses of the regions 50 and 52 of the resist film 20 are larger than the thickness of the flat surface described above.

Figure 2A:
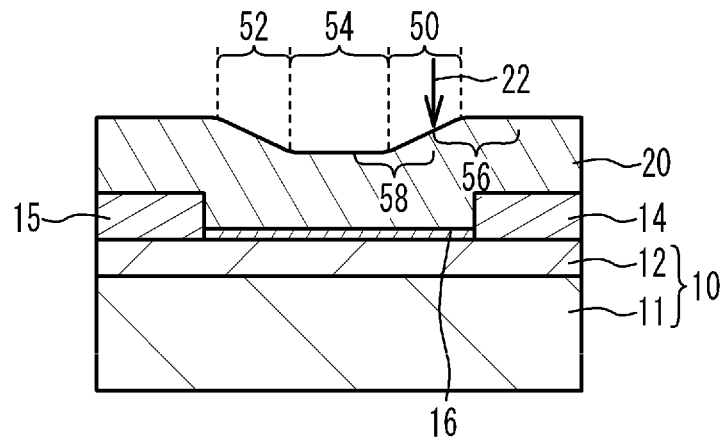
FIGS. 2A to 2D are cross-sectional views illustrating the method for forming the semiconductor device according to the first embodiment (part 2).

As illustrated in FIG. 2A, the resist film 20 in the region 50 is irradiated with an electron beam 22. The resist film 20 is sensitized by the electron beam 22. At this time, in the resist film 20, a region 56 closer to the source electrode 14 than a position irradiated with the electron beam 22 has a larger thickness of the resist film 20 than a region 58 closer to the drain electrode 15 than the position irradiated with the electron beam 22. Therefore, the number of irradiated electrons is relatively small in a region near the lower surface of the resist film 20 under the region 56 where the resist film 20 is thicker. In a region near the upper surface of the resist film 20, a small amount of electrons are reflected by the semiconductor substrate 10. Thus, there are fewer electrons to sensitize the resist film 20. Under the region 58 having a thinner resist film 20 than the region 56, a relatively large amount of electrons are irradiated even in a region near the lower surface of the resist film 20. Since many electrons are reflected by the semiconductor substrate 10, there are many electrons in the region near the upper surface of the resist film 20. Thus, there are relatively many electrons to sensitize the resist film 20. Therefore, the resist film 20 is more sensitized in region 58 than in region 56.

Figure 2B:
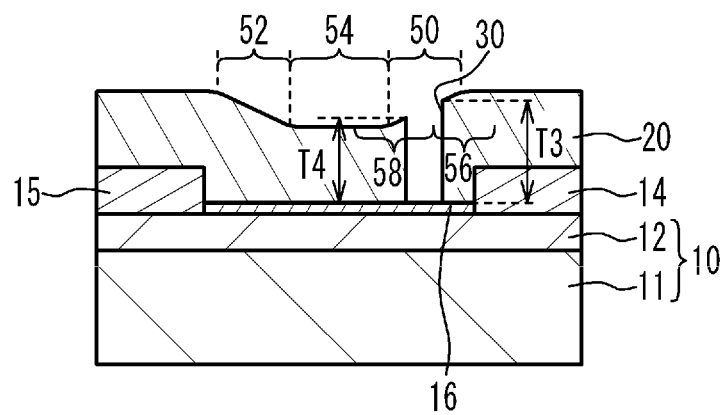

As illustrated in FIG. 2B, the resist film 20 is developed by a spray developing method or a dipping developing method, for example. A developer is a ZED-N50 manufactured by ZEON Corporation, for example. The main component in the ZED-N50 is n-amyl acetate (n-pentyl acetate) with an amount of 99 wt. % or more. A development time is 120 seconds, for example. The development time may be from 60 seconds to 240 seconds depending on the temperature, for example. Thereby, an opening 30 is formed in the resist film 20. At this time, the more sensitized region 58 is opened wider than the region 56, for example, by about 10 nm with respect to the irradiation position of the electron beam 22. An opening length of the opening 30 is 0.05 μm to 0.2 μm, for example. Here, the opening length is, for example, a length in the channel direction of the upper surface of the protective film 16 exposed by the opening 30. The center of the opening length is located near the drain electrode 15 than an irradiation position of the electron beam 22. A thickness T3 of the resist film 20 on the source electrode 14 side of the opening 30 is 520 nm, for example, and a thickness T4 of the resist film 20 on the drain electrode 15 side of the opening 30 is 400 nm, for example.

Figure 2C:
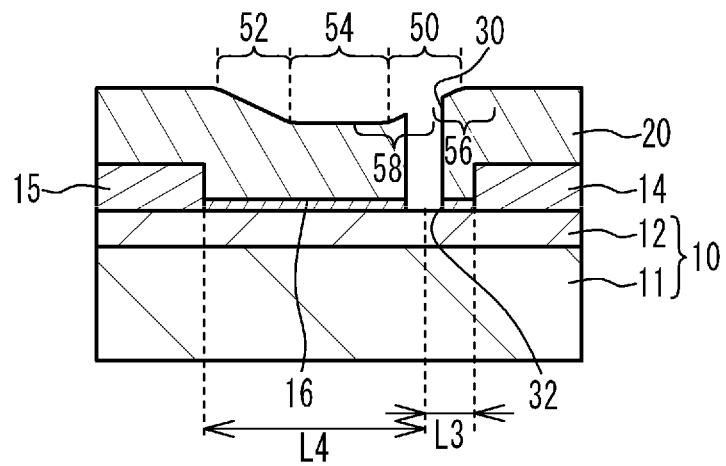

As illustrated in FIG. 2C, the protective film 16 is dry-etched using the resist film 20 as a mask to form an opening 32 in the protective film 16. Thereby, a part of the upper surface of the semiconductor substrate 10 is exposed. A distance L3 between the center of the opening 32 and an end of the source electrode 14 is 0.5 μm, for example, and a distance L4 between the center of the opening 32 and an end of the drain electrode 15 is 2.5 μm, for example. That is, the openings 30 and 32 are provided closer to the source electrode 14 side than a center between the source electrode 14 and the drain electrode 15 in the channel direction.

Figure 2D:
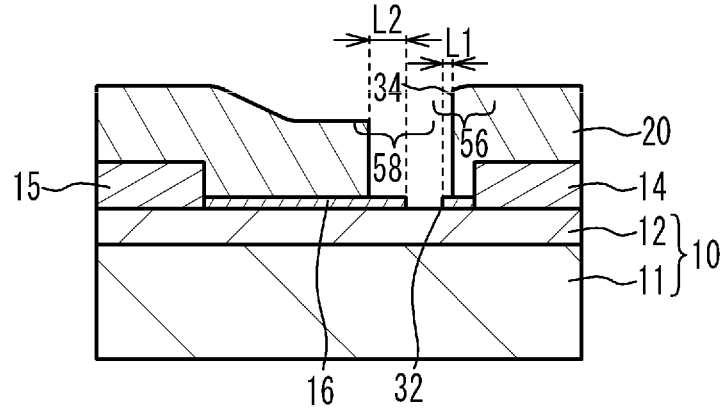

As illustrated in FIG. 2D, the resist film 20 is additionally developed with a developer. The developer may be a developer having the same components as the developer of FIG. 2B or a developer having different components. The more sensitized region 58 is opened wider than the region 56, toward the drain electrode 15. An opening 34 having an opening length longer than the opening 30 is formed. A distance L1 between a side surface (of the protective film 16) provided on the source electrode 14 side of the opening 32 and a side surface (of the resist film 20) provided on the source electrode 14 side of the opening 34 is smaller than a distance L2 between a side surface (of the protective film 16) provided on the drain electrode 15 side of the opening 32 and a side surface (of the resist film 20) provided on the drain electrode 15 side of the opening 34. For example, when the developer is the ZED-N50 and an additional development time is 90 seconds, the distance L1 is 20 nm and the distance L2 is 70 nm. A difference between the thicknesses T3 and T4 of the resist film 20 in FIG. 2B is preferably, for example, 50 nm or more in order to increase the distance L2. The difference between T3 and T4 is preferably, for example, 200 nm or less in order to suppress an opening defect due to the large inclination of the resist film 20 in the channel direction at the irradiation position of the electron beam 22. Therefore, a difference in thickness between the protective film 16 and the source electrode 14 is preferably 50 nm or more and 200 nm or less, for example.

Figure 3A:
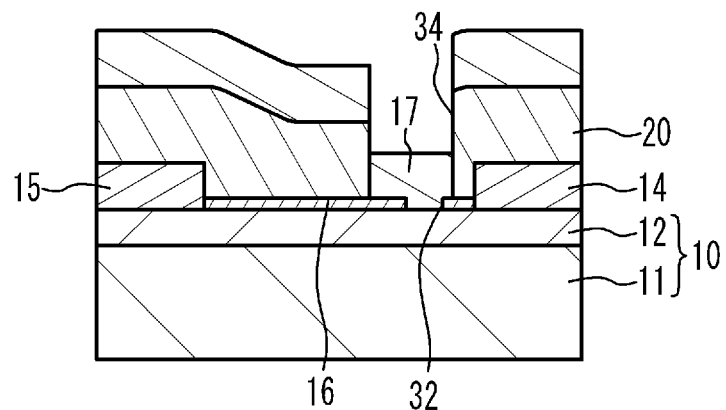
FIGS. 3A and 3B are cross-sectional views illustrating the method for forming the semiconductor device according to the first embodiment (part 3).

As illustrated in FIG. 3A, a metal film 17 is formed in the openings 34 and 32 and on the resist film 20 by using a vacuum deposition method. The metal film 17 includes, for example, a nickel film, a palladium film and a gold film in this order from the semiconductor layer 12 along the film forming direction.

Figure 3B:
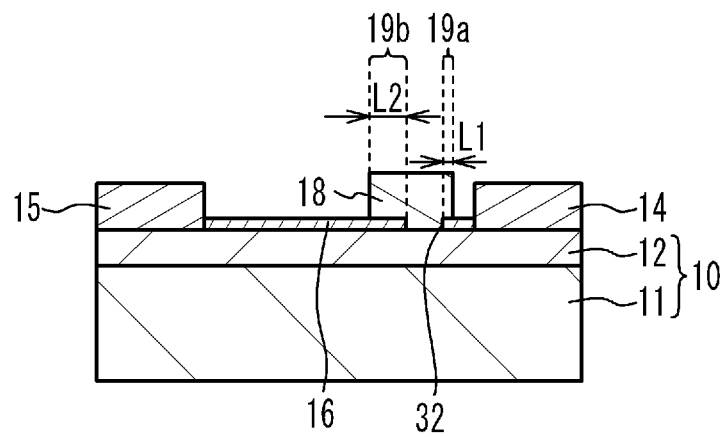

As illustrated in FIG. 3B, the metal film 17 on the resist film 20 is lifted off by removing the resist film 20. Thereby, a gate electrode 18 is formed on the semiconductor substrate 10 in the opening 32. A length of a field plate FP19a in the channel direction provided on the source electrode 14 side of the gate electrode 18 is a distance L1, and a length of a field plate FP19b in the channel direction provided on the drain electrode 15 side is a distance L2. In this way, the length in the channel direction of the FP19a provided on the source electrode 14 side can be made smaller than that of the FP19b provided on the drain electrode 15 side. Therefore, the gate-source capacitance can be reduced, and the concentration of the electric field on the drain electrode 15 side of the gate electrode 18 can be suppressed. Since the opening 30 is formed by using an electron beam drawing method, the opening length of the opening 32 can be reduced in order to reduce the gate length.

When the resist film 20 is formed, the thicknesses of the resist film 20 on the source electrode 14 side and the drain electrode 15 side are substantially the same in a state where the protective film 16 is sandwiched between the source electrode 14 and the drain electrode 15. Therefore, the regions 50 and 52 of the resist film 20 are formed symmetrically with respect to the center of the source electrode 14 and the drain electrode 15. Accordingly, the region 50 is formed on the source electrode 14 side with respect to the center of the source electrode 14 and the drain electrode 15. As described above, the opening 32 is provided in the region 50, and the distance L3 between the center of the opening 32 and the end of the source electrode 14 is set to be smaller than the distance L4 between the center of the opening 32 and the end of the drain electrode 15. A gate-source resistance increases or decreases as the distance L3 increases or decreases, and a gate-drain resistance increases or decreases as the distance L4 increases or decreases. Therefore, the gate-source resistance can be reduced.

Experiment

An experiment was conducted to examine how much the difference between the distances L1 and L2 was caused by the difference in the thicknesses T3 and T4 of the resist film 20. In the experiment, the ZEP520A was used as the resist and the ZED-N50 was used as the developer. To facilitate observation by a SEM (Scanning Electron Microscopy), the opening length of the opening 30 in FIG. 2B was set to about 0.6 μm. The thicknesses T3 and T4 of the resist film 20 were about 520 nm and about 400 nm, respectively. In FIG. 2D, when the additional development was performed for 90 seconds, the distances L1 and L2 became about 20 nm and 70 nm, respectively. Thus, it was found that the distance L2 can be made larger than the distance L1 by making the thickness T3 of the resist film 20 thicker than the thickness T4.

Second Embodiment

Figure 4A:
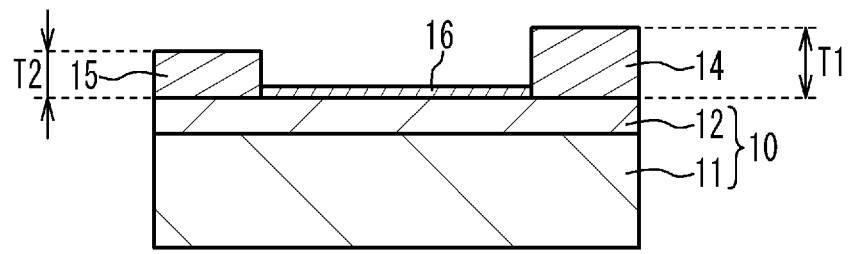
FIGS. 4A to 4C are cross-sectional views illustrating a method for forming a semiconductor device according to a second embodiment (part 1).

A second embodiment describes an example in which the thickness of the source electrode is different from that of the drain electrode when the resist film 20 is formed. FIGS. 4A to 5C are cross-sectional views illustrating a method for forming a semiconductor device according to the second embodiment. Since the steps up to forming the protective film 16 on the surface of the semiconductor substrate 10 are the same as those of the first embodiment, the steps of FIGS. 1A and 1B of the first embodiment are carried out. Next, as illustrated in FIG. 4A, the source electrode 14 and the drain electrode 15 are formed so that the thickness T1 of the source electrode 14 is thicker than the thickness T2 of the drain electrode 15. For example, the source electrode 14 and the drain electrode 15 are formed in different steps. For example, openings for exposing the semiconductor layer 12 are provided in the protective film 16, the opening for forming the source electrode 14 is covered with a resist film in a step of forming the drain electrode 15, and the previously formed drain electrode 15 is covered with a resist film in another step of forming the source electrode 14. The source electrode 14 may be formed first, and then the drain electrode 15 may be formed. The thicknesses T1 and T2 are, for example, 300 nm and 200 nm, respectively.

Figure 4B:
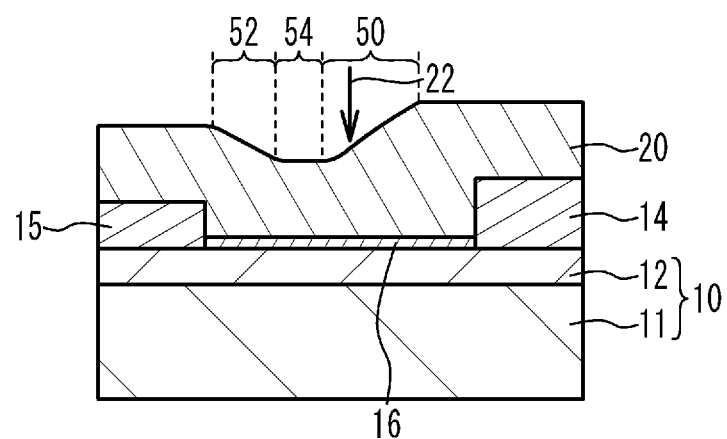
Figure 4C:
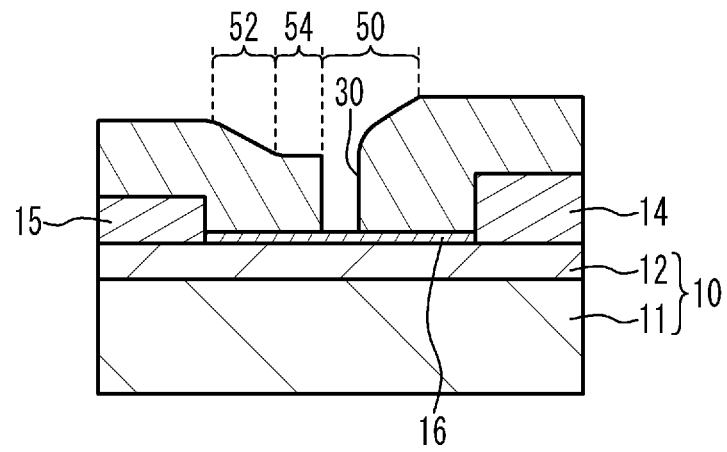

As illustrated in FIG. 4B, the resist film 20 is formed in the same manner as FIG. 1D. The regions 52, 54 and 50 are located near the drain electrode 15, as compared with FIG. 1D of the first embodiment. As illustrated in FIG. 4C, the opening 30 is formed in the resist film 20 in the same manner as FIGS. 2A and 2B. That is, the region 50 of the resist film 20 is irradiated with the electron beam 22 to form the opening 30. In the region 50, the thickness of the resist film 20 increases from the drain electrode 15 side to the source electrode 14 side. The opening 30 is located near the drain electrode 15, as compared with FIG. 1D of the first embodiment.

Figure 5A:
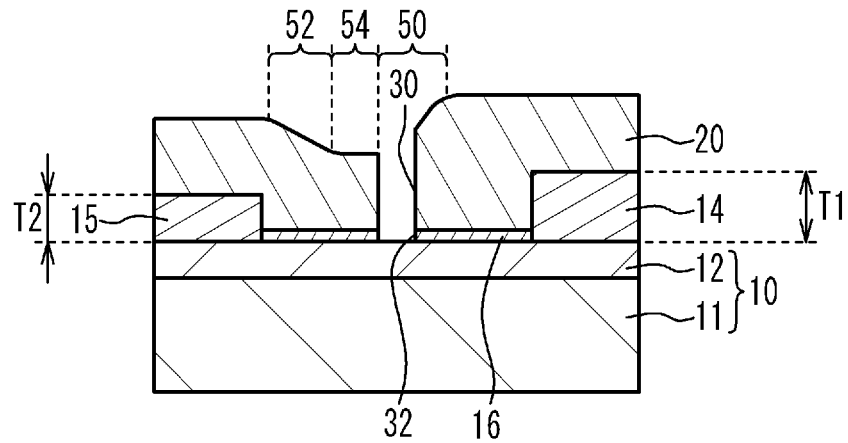
FIGS. 5A to 5C are cross-sectional views illustrating the method for forming the semiconductor device according to the second embodiment (part 2).
Figure 5B:
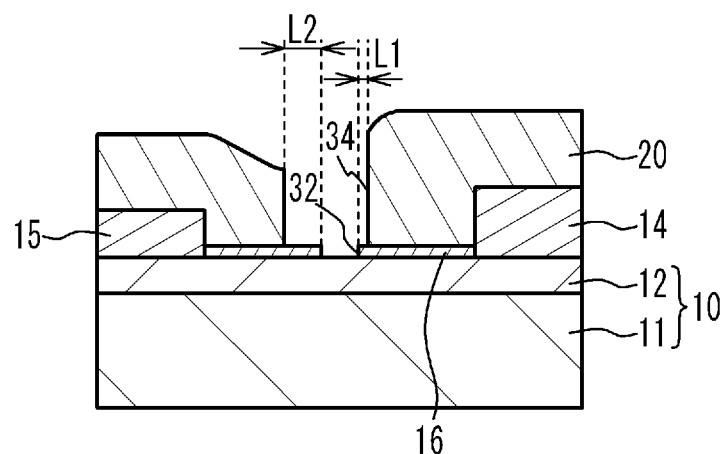
Figure 5C:
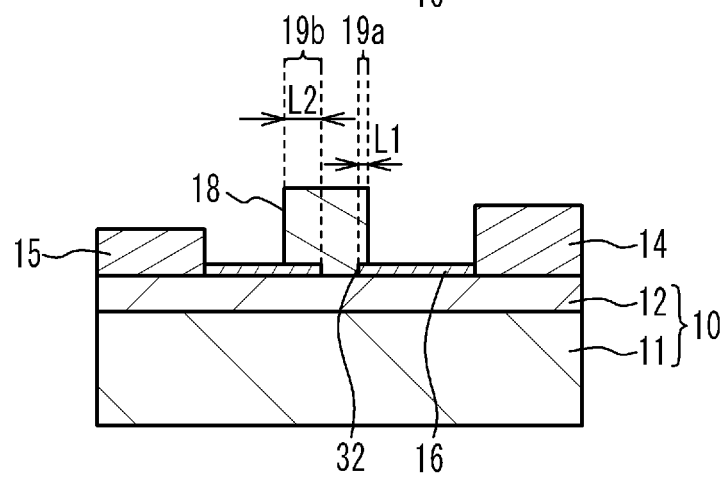

As illustrated in FIG. 5A, the opening 32 is formed in the protective film 16 in the same manner as FIG. 2C. As illustrated in FIG. 5B, the opening 30 is expanded toward the drain electrode 15 side by the additional development in the same manner as FIG. 2D, thereby forming the opening 34. Since the opening 34 is formed to be wider than the opening 30 by the additional development, and the opening 34 includes the opening 30 as the shape of a hole. The opening 30 and the opening 34 are essentially the same in terms of the opening of the resist film 20. However, in order to distinguish the shape and size of the opening before and after the additional development, the opening before the additional development is referred to as the opening 30, and the opening after the additional development is referred to as the opening 34, for convenience. As illustrated in FIG. 5C, the metal film is formed on an entire surface in the same manner as FIGS. 3A and 3B, the metal film formed on the upper surface of the resist film 20 is removed by the lift-off method, and the gate electrode 18 is therefore formed.

In the first embodiment, the gate-source resistance can be reduced. However, the distance between the gate electrode 18 and the source electrode 14 becomes too small, a parasitic capacitance between the gate electrode 18 and the source electrode 14 may be a problem. Further, it may be preferable to form the gate electrode 18 near the center between the source electrode 14 and the drain electrode 15. In the second embodiment, by making the thickness T1 of the source electrode 14 and the thickness T2 of the drain electrode 15 different from each other, the gate electrode 18 is formed within a relatively wide range between the source electrode 14 and the drain electrode 15. When the region 50 of the resist film 20 is irradiated with the electron beam 22, the gate electrode 18 is formed near the center between the source electrode 14 and the drain electrode 15 by making the source electrode 14 thicker than the drain electrode 15. The difference between the thickness T1 of the source electrode 14 and the thickness T2 of the drain electrode 15 is 50 nm or more and 200 nm or less, for example.

Comparative examples will be described to explain the effects of the first embodiment and the second embodiment.

First Comparative Example

Figure 6A:
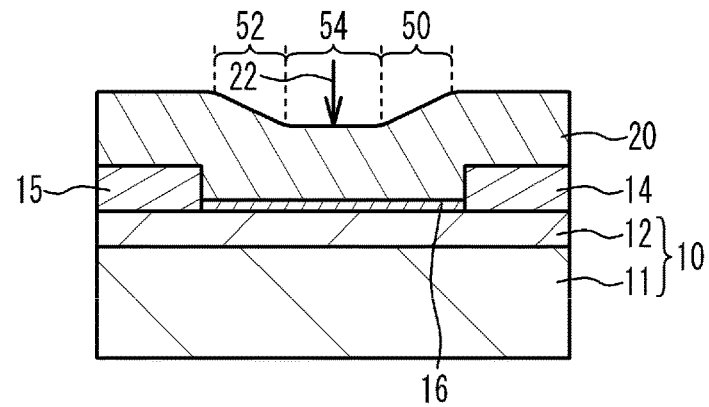
FIGS. 6A to 6D are cross-sectional views illustrating a method for forming a semiconductor device according to a first comparative example.
Figure 6B:
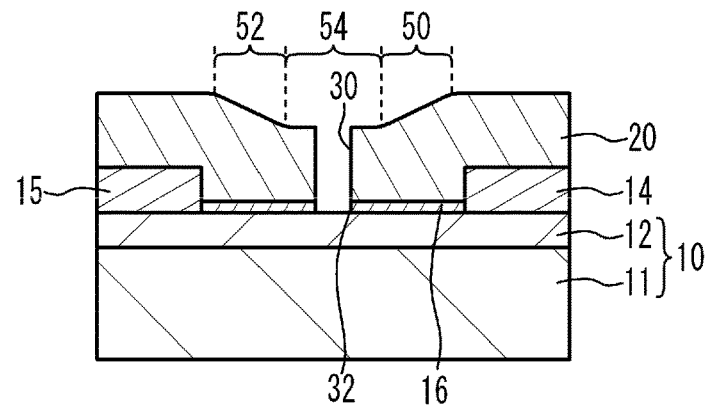

FIGS. 6A to 6D are cross-sectional views illustrating a method for forming a semiconductor device according to a first comparative example. As illustrated in FIG. 6A, the region 54 is irradiated with the electron beam 22 after the step of FIG. 1D of the first embodiment. As illustrated in FIG. 6B, the opening 30 is formed in the resist film 20 and the opening 32 is formed in the protective film 16 in the same manner as FIGS. 2B and 2C. The openings 30 and 32 are formed in the region 54.

Figure 6C:
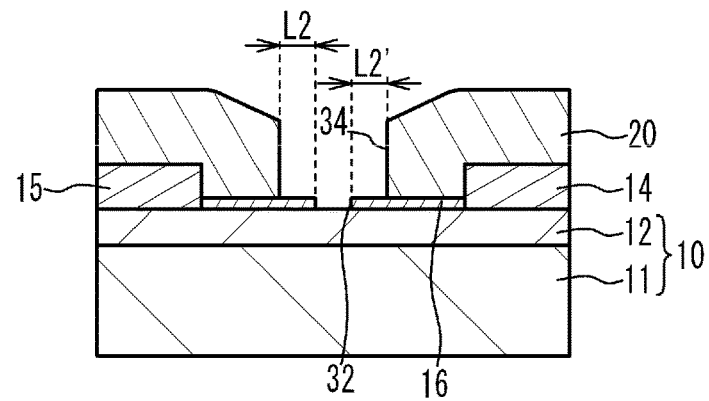

As illustrated in FIG. 6C, the additional development step is performed in the same manner as FIG. 2D. A distance L2' between a side surface of the opening 34 provided on the source electrode 14 side formed in the resist film 20 and the side surface of the opening 32 is substantially the same as the distance L2 between the side surface of the opening 34 provided on the drain electrode 15 side and the side surface of the opening 32. This is because the region 54 where the thickness of the resist film 20 is approximately uniform is irradiated with the electron beam 22, as illustrated in FIG. 6A.

Figure 6D:
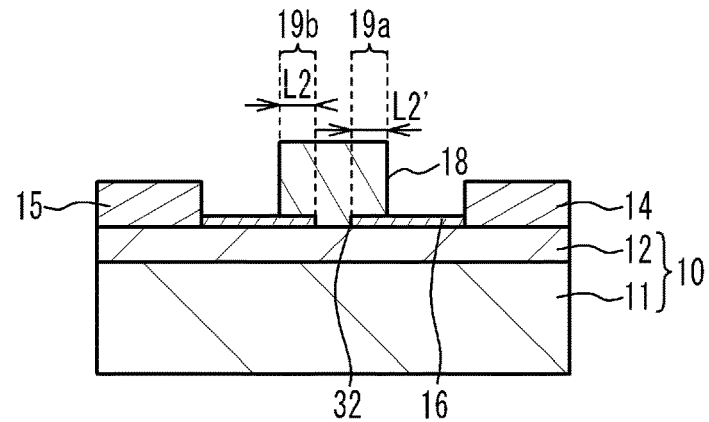

As illustrated in FIG. 6D, the gate electrode 18 is formed in the openings 32 and 34 in the same manner as FIGS. 3A and 3B. The lengths of the FPs 19a and 19b are the distances L2' and L2 which are approximately the same.

In the first comparative example, the length of the FP19a on the source electrode 14 side and the length of the FP19b on the drain electrode 15 side are approximately the same. The FP19b on the drain electrode 15 side preferably has a certain length in order to suppress the concentration of the electric field on the drain electrode 15 side. For example, when the source electrode 14 is grounded, it is not necessary to suppress the concentration of the electric field in the FP19a on the source electrode 14 side. On the other hand, when the FP19a becomes long, the gate-source capacitance increases, and the high frequency characteristic of the transistor may deteriorate. In the following second comparative example, the FP 19a is made shorter than the FP 19b.

Second Comparative Example

Figure 7A:
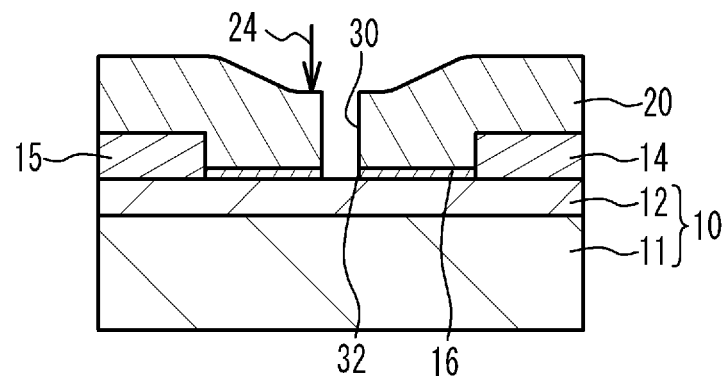
FIGS. 7A to 7C are cross-sectional views illustrating a method for forming a semiconductor device according to a second comparative example.
Figure 7B:
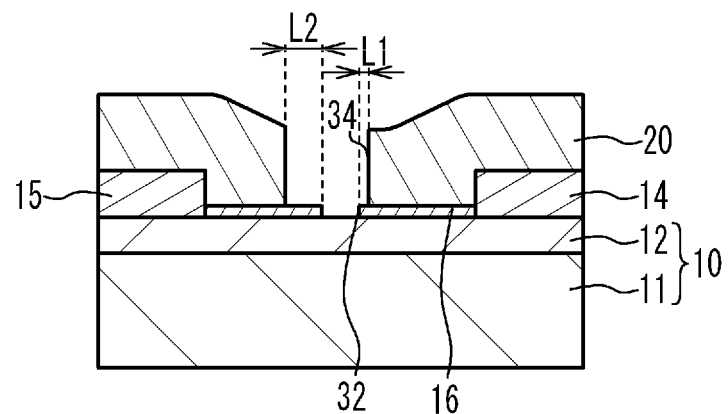
Figure 7C:
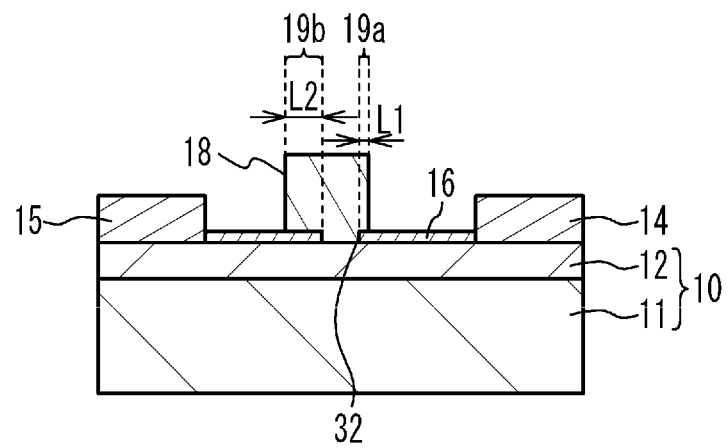

FIGS. 7A to 7C are cross-sectional views illustrating a method for forming a semiconductor device according to a second comparative example. As illustrated in FIG. 7A, the resist film 20 provided closer to the drain electrode 15 than the opening 30 is irradiated with the electron beam 24 after FIG. 6B of the first comparative example. As illustrated in FIG. 7B, the resist film 20 is developed. Thereby, the opening 34 is expanded toward the drain electrode 15 side, compared to the expansion of the source electrode 14 side of the opening 30. Therefore, the distance L2 is longer than the distance L1.

As illustrated in FIG. 7C, the gate electrode 18 is formed in the same manner as FIG. 6D of the first comparative example. The length of the FP 19a on the source electrode 14 side is smaller than that of the FP 19b on the drain electrode 15 side. Thereby, the gate-source capacitance can be suppressed, and deterioration of the transistor characteristic can be suppressed. However, since the electron beam drawing is performed twice, the time required for drawing is doubled, and the throughput for forming the gate electrode 18 is reduced. Further, it is difficult to accurately align a first irradiation position of the electron beam 22 with a second irradiation position of the electron beam 24, and hence variation in the length of the FP 19b occurs. The FP19b is preferably long from the viewpoint of suppressing the concentration of the electric field on the drain electrode 15 side of the gate electrode 18. However, when the FP19b is too long, the gate-drain capacitance becomes large, which causes deterioration of the high frequency characteristic of the transistor. Therefore, it is preferable to reduce the manufacturing variation in the length of the FP 19b.

According to the first embodiment, the protective film 16 is formed on the semiconductor substrate 10, as illustrated in FIG. 1B. As illustrated in FIGS. 1D and 4B, the resist film 20 is formed on the protective film 16 such that the resist film 20 has the region 50 where the resist film 20 becomes thicker from the drain electrode 15 side to the source electrode 14 side, the region 50 being provided between the source electrode 14 and the drain electrode 15. As illustrated in FIGS. 2A, 2B and 4C, the opening 30 (i.e., a first opening) is formed in the resist film 20 by irradiating the resist film 20 in the region 50 with the electron beam 22 and developing the resist film 20. As illustrated in FIGS. 2C and 5A, the opening 32 (i.e., a second opening) is formed in the protective film 16 by removing a part of the protective film 16 using the resist film 20 on which the opening 30 is formed as a mask. The semiconductor layer 12 is exposed by the opening 32. As illustrated in FIGS. 2D and 5B, the opening 34 (i.e., a third opening), which brings the side surface of the opening 30 on the drain electrode 15 side closer to the drain electrode 15 and exposes the upper surface of the semiconductor substrate 10, is formed in the resist film 20 by further developing the resist film 20. The opening length of the opening 34 in the resist film 20 is longer than the opening length of the opening 30, and a difference in the opening lengths is mainly located closer to the drain electrode 15 than the opening 32 of the protective film 16. As illustrated in FIGS. 3B and 5C, the gate electrode 18 is formed in the openings 32 and 34.

Thereby, the FP 19a of the gate electrode 18 can be made shorter than the FP 19b. Therefore, the increase in the gate-source capacitance as in the first comparative example can be suppressed, and the deterioration of the high frequency characteristic of the transistor can be suppressed. Moreover, the irradiation of the electron beam 22 is required only once. Thereby, the throughput can be improved as compared to two drawings of the electron beams 22 and 24 as in the second comparative example. In addition, it is possible to suppress the variation in characteristic due to the variation in alignment in the channel direction between the irradiation position of the electron beam 22 and the irradiation position of the electron beam 24. When reducing the gate length, it is difficult to reduce the gate length to a desired length if there is large variation in this alignment.

As illustrated in FIGS. 1D and 4B, in the formation of the resist film 20, the thicknesses of the source electrode 14 and the drain electrode 15 are set to be larger than the thickness of the protective film 16, and the resist film 20 is formed so that the resist film 20 covers the source electrode 14 and the drain electrode 50 to form the region 50. As illustrated in FIGS. 2A and 4B, in the irradiation of the electron beam 22, the region closer to the source electrode 14 than the region 54 is irradiated with the electron beam 22. Thereby, the opening 30 can be formed in the region 50 where the resist film 20 becomes thicker toward the source electrode 14. The region 50 may be formed by another method such as forming a dummy layer corresponding to the source electrode 14, for example.

In the first embodiment, the thicknesses of the source electrode 14 and the drain electrode 15 are substantially the same. In this case, in the resist film 20, the distance between the region 50 and the source electrode 14 is shorter than the distance between the region 50 and the drain electrode 15. Thereby, the gate-source resistance can be reduced.

In the second embodiment, the thickness of the source electrode 14 is set to be larger than the thickness of the drain electrode 15. Thereby, the distance between the region 50 and the source electrode 14 can be made longer than that in the first embodiment. Therefore, in the channel direction, the gate electrode 18 can be provided from the vicinity of the center of the source electrode 14 and the drain electrode 15 to the position closer to the source electrode 14 than the vicinity of the center.

If the reason for the dissolution of the resist film 20 on the drain electrode 15 side by the additional development is that the number of electrons irradiated on the resist film 20 differs depending on the thickness of the resist film 20, it is considered that this is a general phenomenon that occurs regardless of the type of the resist film 20 and the developer. Therefore, resists and developers other than the above-mentioned resist film 20 and the above-mentioned developer may be used.

It is noted that the embodiments disclosed herein are merely illustrative in all aspects and should not be recognized as being restrictive. The scope of the present invention is defined by the scope of the claims, not in the above-mentioned meaning, and is intended to include meaning equivalent to the scope of the claims and all modifications within the scope.

What is claimed is:

1. A method for manufacturing a semiconductor device having a source electrode, a drain electrode, and a gate electrode provided between the source electrode and the drain electrode, the method comprising steps of:
    forming a protective film on a semiconductor substrate;
    forming a resist film on the protective film such that the resist film includes a region where the resist film becomes thicker from the drain electrode to the source electrode, the region being provided between the source electrode and the drain electrode;
    forming a first opening in the resist film by irradiating the resist film in the region with an electron beam and developing the resist film;
    forming a second opening that exposes an upper surface of the semiconductor substrate by removing the protective film using the resist film in which the first opening is formed as a mask;
    forming a third opening in the resist film by further developing the resist film after forming the second opening, the third opening being formed by expanding the first opening toward the drain electrode; and
    forming the gate electrode in the second opening and the third opening.

2. The method for manufacturing the semiconductor device according to claim 1, wherein
    the step of forming the resist film includes setting thicknesses of the source electrode and the drain electrode to be larger than a thickness of the protective film, and forming the resist film so that the resist film covers the source electrode and the drain electrode to form the region.

3. The method for manufacturing the semiconductor device according to claim 2, wherein
    a distance between the region and the source electrode is shorter than a distance between the region and the drain electrode.

4. The method for manufacturing the semiconductor device according to claim 2, wherein
    in the step of forming the resist film, a thickness of the source electrode is set to be larger than that of the drain electrode.

* * * * *